United States Patent
Shahan et al.

(10) Patent No.: US 10,815,771 B2
(45) Date of Patent: Oct. 27, 2020

(54) THERMAL REGULATION AND VIBRATION ISOLATION SYSTEM

(71) Applicant: HRL LABORATORIES, LLC, Malibu, CA (US)

(72) Inventors: David W. Shahan, Los Angeles, CA (US); Ryan T. Freeman, Novato, CA (US); Deborah J. Kirby, Calabasas, CA (US); Ryan G. Quarfoth, Los Angeles, CA (US); Geoffrey P. McKnight, Los Angeles, CA (US)

(73) Assignee: HRL Laboratories, LL, Malibu, CA (US)

( * ) Notice: Subject to any disclaimer, the term of this patent is extended or adjusted under 35 U.S.C. 154(b) by 142 days.

(21) Appl. No.: 16/017,669

(22) Filed: Jun. 25, 2018

(65) Prior Publication Data
US 2018/0371892 A1   Dec. 27, 2018

Related U.S. Application Data

(60) Provisional application No. 62/525,031, filed on Jun. 26, 2017.

(51) Int. Cl.
*E21B 47/017* (2012.01)
*F16F 15/02* (2006.01)
(Continued)

(52) U.S. Cl.
CPC ............ *E21B 47/017* (2020.05); *F16F 13/08* (2013.01); *F16F 15/02* (2013.01); *G01D 11/245* (2013.01); *H05K 5/0213* (2013.01); *H05K 5/04* (2013.01); *H05K 7/20436* (2013.01); *F16F 2222/025* (2013.01); *F16F 2224/02* (2013.01); *F28D 2021/0028* (2013.01)

(58) Field of Classification Search
CPC ..... F28D 2021/0028; F28D 2021/0029; E21B 36/00; E21B 36/001; E21B 36/003; E21B 47/017
See application file for complete search history.

(56) References Cited

U.S. PATENT DOCUMENTS 4,375,157 A * 3/1983 Boesen ............. H05K 7/20336
62/49.2
4,654,754 A   3/1987 Daszkowski
(Continued)

OTHER PUBLICATIONS

International Search Report and Written Opinion dated Oct. 26, 2018 for corresponding PCT Application No. PCT/US2018/039340 (14 pages).

*Primary Examiner* — Kenneth L Thompson
(74) *Attorney, Agent, or Firm* — Lewis Roca Rothgerber Christie, LLP

(57) ABSTRACT

A system configured to provide thermal regulation and vibration isolation to one or more electronic components. The system includes a sensor chassis defining an interior chamber, an electronics housing in the interior chamber of the sensor chassis, a thermoelectric cooler coupled between the sensor chassis and the electronics housing, a thermal strap coupled to the sensor chassis, and at least one isolator coupled to the sensor chassis. The system may also include an insulating material, such as Aerogel, in the interior chamber of the sensor chassis and extending around the electronics housing.

19 Claims, 6 Drawing Sheets
(3 of 6 Drawing Sheet(s) Filed in Color)

(51) Int. Cl.
   *F16F 13/08*   (2006.01)
   *H05K 5/04*    (2006.01)
   *H05K 5/02*    (2006.01)
   *H05K 7/20*    (2006.01)
   *G01D 11/24*   (2006.01)
   *F28D 21/00*   (2006.01)

(56) References Cited

U.S. PATENT DOCUMENTS

| | | | |
|---|---|---|---|
| 4,896,098 A | | 1/1990 | Haritonidis et al. |
| 5,077,637 A | | 12/1991 | Martorana et al. |
| 5,547,028 A | * | 8/1996 | Owens .................. E21B 36/003 |
| | | | 166/302 |
| 5,931,000 A | | 8/1999 | Turner et al. |
| 6,134,892 A | | 10/2000 | Turner et al. |
| 7,440,283 B1 | * | 10/2008 | Rafie .................... E21B 47/011 |
| | | | 165/185 |
| 8,220,545 B2 | * | 7/2012 | Storm, Jr. ............. E21B 47/011 |
| | | | 166/302 |
| 8,820,397 B2 | * | 9/2014 | Marzouk ............... E21B 36/001 |
| | | | 166/302 |
| 10,410,999 B2 | * | 9/2019 | Baloglu ................ H01L 21/486 |
| 2007/0056771 A1 | | 3/2007 | Gopalan et al. |
| 2009/0004454 A1 | | 1/2009 | Aumaugher et al. |
| 2013/0148300 A1 | | 6/2013 | Hovik |
| 2013/0206395 A1 | | 8/2013 | Cramer |
| 2014/0190677 A1 | | 7/2014 | Platus et al. |
| 2015/0376959 A1 | | 12/2015 | Dinica et al. |
| 2016/0061538 A1 | * | 3/2016 | Turqueti ................ F28F 13/00 |
| | | | 236/1 F |
| 2019/0316442 A1 | * | 10/2019 | Rafie .................... E21B 36/001 |

* cited by examiner

THERMAL REGULATION AND VIBRATION ISOLATION SYSTEM

CROSS-REFERENCE TO RELATED APPLICATION

The present application claims priority to and the benefit of U.S. Provisional Application No. 62/525,031, filed Jun. 26, 2017, the entire content of which is incorporated herein by reference.

FIELD

The present disclosure relates generally to thermal and vibration isolation systems.

BACKGROUND

Thermally stable chambers are commonly utilized to regulate the temperature of a payload (e.g., one or more electronic components such as sensors) housed inside the chamber. Additionally, mechanical isolation devices, such as elastomer mounts and bushings, are commonly utilized to attenuate the transmission of vibrations and/or shocks to a payload. In the related art, thermally stable chambers and mechanical isolation device exist separately. Combining thermally stable chambers and mechanical isolation devices in related art systems is not feasible because mechanical isolation requires a high degree of relative displacement between the vibration source and the payload, whereas the most efficient way to dissipate heat from a thermally stabilized enclosure is through a rigid metal interface that precludes high relative displacements and thus transmits vibrations and/or shocks to the payload.

SUMMARY

The present disclosure is directed to various systems configured to provide both thermal regulation and vibration isolation. In one embodiment, the system includes a sensor chassis defining an interior chamber, an electronics housing in the interior chamber of the sensor chassis, a thermoelectric cooler between the sensor chassis and the electronics housing, a thermal strap coupled to the sensor chassis, and at least one isolator coupled to the sensor chassis.

The system may also include an insulating material in the interior chamber of the sensor chassis that extends around the electronics housing. The insulating material may be Aerogel.

The thermal strap may include first and second copper blocks and a series of copper wires extending between the first and second copper blocks. The thermoelectric cooler may be coupled to a portion of an inner surface of the sensor chassis, and the first copper block of the thermal strap may be coupled to a portion of an outer surface of the sensor chassis opposite the portion of the inner surface.

The system may also include at least one clamp coupling the electronics housing to the sensor chassis. The at least one clamp may be formed of polyether ether ketone (PEEK). The electronics housing may be formed of aluminum.

The isolator may include a primary chamber, a backpressure chamber, a liquid contained in the primary chamber and the backpressure chamber, and a conduit extending between the primary chamber and the backpressure chamber. The conduit places the primary chamber in communication with the backpressure chamber. The system may also include a backpressure membrane defining at least a portion of the backpressure chamber, an elastomer dome defining at least a portion of the primary chamber, and a shaft having a first end coupled to the elastomer dome and a second end coupled to the sensor chassis. The system may include a first isolator coupled to a first end of the sensor chassis and a second isolator coupled to a second end of the sensor chassis opposite the first end.

A drill system according to another embodiment of the present disclosure includes a drill string, a pressure casing coupled to the drill string, and a sensor chassis defining an interior chamber. The sensor chassis is housed in the pressure casing and spaced apart from the pressure casing by a gap. The drill system also includes an electronics housing in the interior chamber of the sensor chassis, a thermoelectric cooler coupled between the sensor chassis and the electronics housing, and a thermal strap extending across the gap. The thermal strap has a first end coupled to the sensor chassis and a second end coupled to the pressure casing. The drill system also includes at least one isolator coupled between the drill string and the sensor chassis. The drill system may include a first isolator coupled to a first end of the sensor chassis and a second isolator coupled to a second end of the sensor chassis opposite the first end.

The present disclosure is also directed to various methods of thermally and vibrationally isolating a payload. In one embodiment, the method includes inserting a thermoelectric cooler into an interior chamber of a sensor chassis, inserting an electronics housing accommodating the payload into the interior chamber and onto the thermoelectric cooler, injecting an insulating material into the interior chamber and around the electronics housing, and connecting a thermal strap to the sensor chassis.

This summary is provided to introduce a selection of features and concepts of embodiments of the present disclosure that are further described below in the detailed description. This summary is not intended to identify key or essential features of the claimed subject matter, nor is it intended to be used in limiting the scope of the claimed subject matter. One or more of the described features may be combined with one or more other described features to provide a workable device.

BRIEF DESCRIPTION OF THE DRAWINGS

These and other features and advantages of embodiments of the present disclosure will become more apparent by reference to the following detailed description when considered in conjunction with the following drawings. In the drawings, like reference numerals are used throughout the figures to reference like features and components. The figures are not necessarily drawn to scale. Additionally, the patent or application file contains at least one drawing executed in color. Copies of this patent or patent application publication with color drawing(s) will be provided by the Office upon request and payment of the necessary fee.

DETAILED DESCRIPTION

The present disclosure is directed to various embodiments of a system configured to provide thermal regulation and vibration isolation to one or more components, such as a sensor chassis in a hydrocarbon drill well or an electronics suite in a missile.

Figure 1:
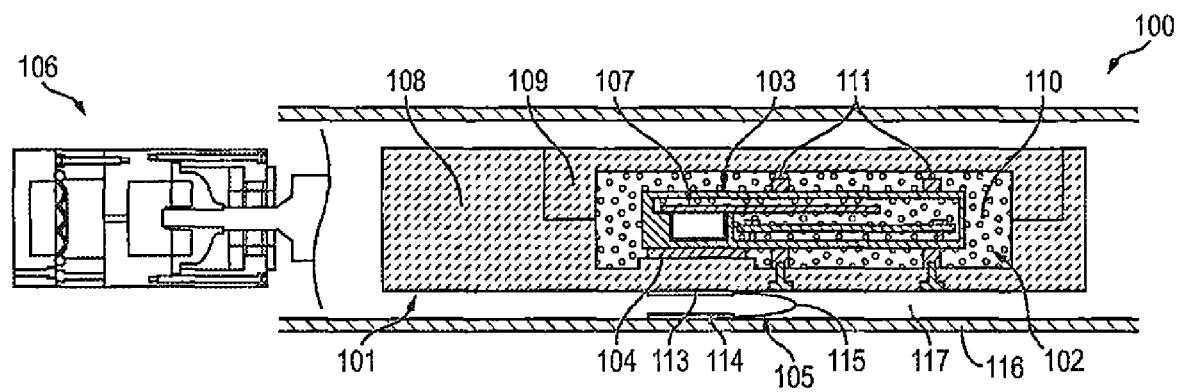
FIG. 1 is a schematic cross-sectional view of a system configured to provide both thermal regulation and vibration isolation according to one embodiment of the present disclosure.

With reference now to FIG. 1, a system 100 according to one embodiment of the present disclosure includes a sensor chassis 101 defining an interior chamber 102 (e.g., a pocket), an electronics housing 103 in the interior chamber 102 of the sensor chassis 101, a thermoelectric cooler 104 (e.g., a Peltier heat pump) coupled between the sensor chassis 101 and the electronics housing 103, a thermal strap 105 coupled to the sensor chassis 101, and at least one isolator 106 coupled, directly or indirectly, to the sensor chassis 101. The electronics housing 103 may house any component or components 107 for which the system is configured to provide both thermal regulation and vibration isolation, such as, for instance, sensors or other electronic components. In one or more embodiments, the electronics housing 103 may be made out of any suitably thermally conductive material, such as, for instance, aluminum. The thermoelectric cooler 104 and the thermal strap 105 are configured to provide thermal regulation to the one or more components 107 housed in the electronics housing 103 by drawing heating away from the one or more components housed in the electronics housing 103. The isolator 106 is configured to attenuate the transmission of vibrations and/or shocks to the sensor chassis 101 to isolate the one or more components 107 in the electronics housing 103 from unwanted vibrations and/or shocks. Additionally, the thermal strap 105 is configured to provide mechanical compliance, which permits the isolator 106 to provide mechanical isolation of the sensor chassis 101 from unwanted vibrations and/or shocks (e.g., vibration isolation requires relative displacement between the sensor chassis 101 and the source of unwanted vibrations and/or shocks, and the flexibility of the thermal strap 105 is configured to permit the sensor chassis 101 to move when vibrations and/or shocks are transmitted to the system 100 while still providing a thermal path for dissipating heat away from the sensor chassis 101).

In the illustrated embodiment, the sensor chassis 101 includes a body portion 108 and a cover 109 configured to be coupled to the body portion 108 in such a manner that permits the cover 109 to be detached from the body portion 108. Together, the body portion 108 and the cover 109 of the sensor chassis 101 define the interior chamber 102. The cover 109 is configured to be detached from the body portion 108 of the sensor chassis 101 to provide access to the interior chamber 102 of the sensor chassis 101.

With continued reference to the embodiment illustrated in FIG. 1, the systems 100 also includes an insulating material 110 in the interior chamber 102 of the sensor chassis 101. In the illustrated embodiment, the insulating material 110 fills or substantially fills the portion of the interior chamber 102 between the electronics housing 103 and the sensor chassis 101 (e.g., the insulating material 110 entirely surrounds or substantially entirely surrounds the electronics 103 housing except for the portion of the electronics housing 103 in contact with the thermoelectric cooler 104). The insulating material 110 may be any suitable type or kind of insulating material, such as, for instance aerogel (e.g., silica aerogel).

Figure 2A:
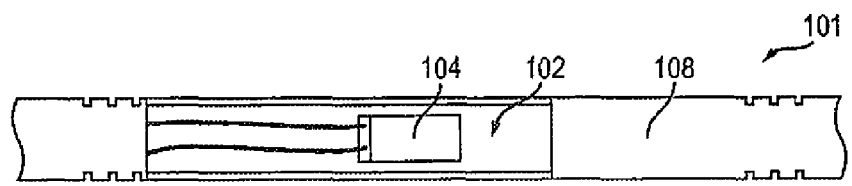
FIGS. 2A-2C illustrate tasks of assembling the embodiment of the system illustrated in FIG. 1.
Figure 2B:
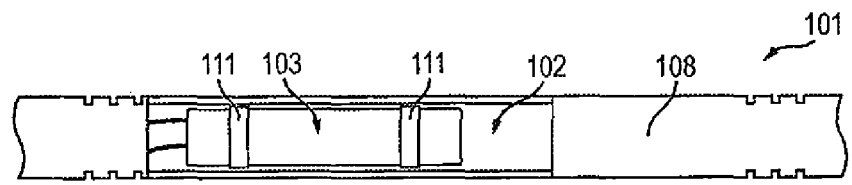
Figure 2C:
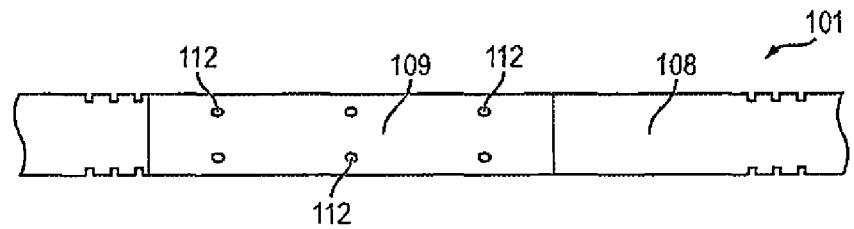

FIGS. 2A-2C depict tasks of assembling the sensor chassis 101 according to one embodiment of the present disclosure. FIG. 2A illustrates a state in which the cover 109 has first been removed from the body portion 108 of the sensor chassis 101 to expose the interior chamber 102. The thermoelectric cooler 104 may then be inserted into the interior chamber 102. As illustrated in FIG. 2B, the electronics housing 103 may then be inserted into the interior chamber 102 and onto the thermoelectric cooler 104. The electronics housing 103 may then be coupled to the sensor chassis 101, such as, for instance, by one or more clamps 111 (e.g., two or more clamps). In one or more embodiments, the one or more clamps 111 may be made of polyether ether ketone (PEEK). The insulating material 110, such as aerogel, may then be poured into the interior chamber 102 and around the electronics housing 103. In one or more embodiments, the insulating material 110 may be poured into the interior chamber 102 until the insulating material 110 completely surrounds or substantially completely surrounds the electronics housing 103. The cover 109 may then be reattached (e.g., with fasteners) to the body portion 108 of the sensor chassis 101, as illustrated in FIG. 2C. In one or more embodiments, the sensor chassis 101 includes one or more ports 112 (e.g., openings in the cover 109 and/or the body portion 108) configured to permit the insulating material 110, or an additional amount of the insulating material 110, to be injected into the interior chamber 102 of the sensor chassis 101 after the cover 109 has been reattached to the body portion 108 of the sensor chassis 101. Once the insulating material 110 has been injected into the interior chamber 102 through the ports 112, the ports 112 may sealed by tape (e.g., a polyimide film) and/or potting material to prevent the insulating material 110 from leaking out through the one or more ports 112.

Figure 3:
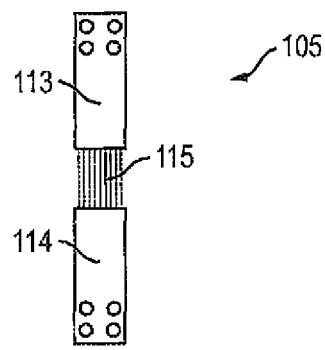
FIG. 3 depicts a thermal strap according to one embodiment of the present disclosure.

With reference now to FIG. 3, the thermal strap 105 according to one or more embodiments of the present disclosure includes a first block 113, a second block 114, and a series of flexible wires 115 extending between the first and second blocks 113, 114. In the illustrated embodiment, the first block 113 includes a series of openings (e.g., blind bores) configured to receive first ends of the flexible wires 115 and the second block 114 includes a series of openings (e.g., blind bores) configured to receive second ends of the flexible wires 115. In one or more embodiments, the flexible wires 115 may be press-fit into the openings in the first and second blocks 113, 114. In the illustrated embodiment, the first and second blocks 113, 114 and the wires 115 are made of copper, although in one or more embodiments the first and second blocks 113, 114 and the wires 115 may be may of any other material exhibiting suitable thermal conductivity. In the embodiment illustrated in FIG. 1, the first block 113 is coupled to the sensor chassis 101, the second block 114 is configured to be coupled to another component 116 (e.g., a pressure casing) spaced apart from the sensor chassis 101 by a gap 117, and the wires 115 span the gap 117 between the sensor chassis 101 and the component 116. Heat generated by the one or more electronic components 107 in the electronics housing 103 is transferred by the thermoelectric cooler 104 to the sensor chassis 101, and the heat transferred to the sensor chassis 101 is transferred away from the sensor chassis 101 by the thermal strap 105. In the illustrated embodiment, the thermoelectric cooler 104 is coupled to a portion of an inner surface of the sensor chassis 101 and the first block 113 of the thermal strap 105 is coupled to a portion of an outer surface of the sensor chassis 101 opposite the portion of the inner surface (e.g., the thermoelectric cooler 104 is opposite the first block 113 of the thermal strap 105). In one or more embodiments, the thermoelectric cooler 104 utilizes the Peltier effect to create a heat flux transferring heat from one side of the thermoelectric cooler 104 facing the electronics housing 103 to an opposite side of the thermoelectric cooler 104 facing away from the electronics housing 103 (e.g., a side facing the sensor chassis 101). In this manner, the thermoelectric cooler 104 and the thermal strap 105 are configured to transfer and dissipate the heat generated by the one or more electronic components 107 in the electronics housing 103, which thermally regulates the one or more electronic components 107 in the electronics housing 103.

Figure 4:
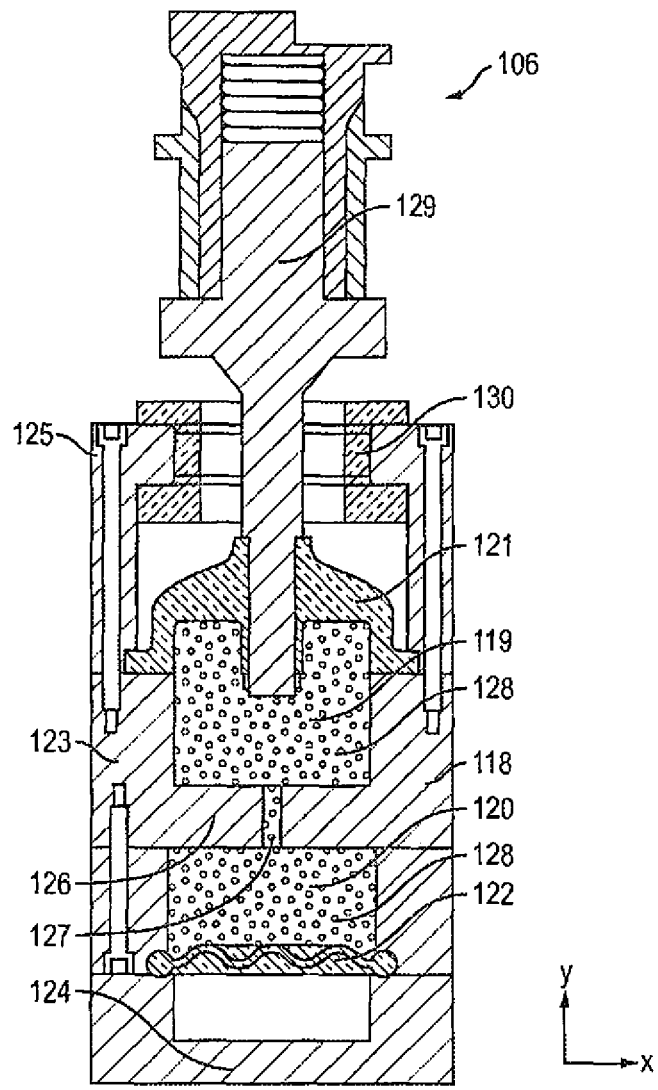
FIG. 4 depicts an isolator according to one embodiment of the present disclosure.

With reference now to the embodiment illustrated in FIG. 4, the isolator 106 includes a case or a housing 118, a primary isolation chamber 119 in the housing 118, a backpressure chamber 120 in the housing 118, an elastomer dome 121 in the housing 118, and a backpressure membrane 122 in the housing 118. In one or more embodiments, the elastomer dome 121 and the backpressure membrane 122 are each made out of a resilient (e.g., elastic) material. In one or more embodiments, the backpressure membrane 122 is made out of silicone elastomer (e.g., liquid silicone rubber (LSR) 5840 offered by NuSil™). In the illustrated embodiment, the housing 118 includes a sidewall 123 (e.g., a cylindrical sidewall) extending between a first end 124 of the housing 118 and a second end 125 of the housing 118 opposite the first end 124. Although in the illustrated embodiment the housing 118 is generally cylindrical, in one or more embodiments the housing 118 may have any other shape suitable for the environment in which the isolator 106 is intended to be utilized to attenuate unwanted vibrations and/or shock. In the illustrated embodiment, the backpressure chamber 120 is proximate to the first end 124 of the housing 118 and the primary isolation chamber 119 is proximate to the second end 125 of the housing 118.

With continued reference to the embodiment illustrated in FIG. 4, the housing 118 includes a wall or partition 126 connected to the sidewall 123. The partition 126 is positioned at an intermediate position between the first and second ends 124, 125 of the housing 118. The partition 126 separates the backpressure chamber 120 from the primary isolation chamber 119. Additionally, in the illustrated embodiment, the partition 126 defines an opening 127 (e.g., a conduit) placing the primary isolation chamber 119 in fluid communication with the backpressure chamber 120. In the illustrated embodiment, the primary isolation chamber 119 is defined between the elastomer dome 121, the partition 126, and a portion of the sidewall 123 proximate to the second end 125 of the housing 118. In the illustrated embodiment, the backpressure chamber 120 is defined between the backpressure membrane 122, the partition 126, and a portion of the sidewall 123 proximate to the first end 124 of the housing 118.

With continued reference to the embodiment illustrated in FIG. 4, the isolator 106 includes a volume of liquid 128 in the primary isolation chamber 119 and the backpressure chamber 120. In one or more embodiments, the liquid 128 contained in the primary isolation chamber 119 and the backpressure chamber 120 is oil (e.g., a high viscosity oil such as high viscosity mineral oil).

In the illustrated embodiment, the first end 124 of the housing 118 is configured to be connected to a vibration source (e.g., a drill string). In one or more embodiments, an outer surface of the sidewall 123 at the first end 124 includes external threads and/or the first end 124 of the housing 118 may define a series of internally threaded openings configured to accommodate fasteners coupling the isolator 106 to the vibration source.

With continued reference to the embodiment illustrated in FIG. 4, the isolator 106 also includes a shaft 129 connected to the elastomer dome 121. In the illustrated embodiment, the shaft 129 is connected to the housing 118 by the elastomer dome 121. In the illustrated embodiment, the shaft 129 extends out through an opening 130 in the second end 125 of the housing 118. The shaft 129 is coupled to the sensor chassis, and the isolator 106 is configured to isolate the sensor chassis from unwanted vibrations and/or shocks transmitted to the housing 118 from the vibration source (i.e., the isolator 106 is configured to attenuate the transmission of unwanted vibrations from the vibration source to the sensor chassis connected to the shaft 129).

In operation, movement of the housing 118 caused by vibrations and/or a shock transmitted to the housing 118 of the isolator 106 causes the elastomer dome 121 to deflect (e.g., deform), which reduces or limits transmission of the vibrations and/or the shock to the sensor chassis connected to the shaft 129. That is, the deformable elastomer dome 121 effectively decouples the shaft 129 from the housing 118 to reduce the transmission of vibrations and/or shock to the sensor chassis connected to the shaft 129. In the illustrated embodiment, the elastomer dome 121 is configured to deflect both radially (i.e., the x-direction in FIG. 4) and axially (i.e., the y-direction in FIG. 4) to provide vibration isolation in all translational directions. In this manner, the elastomer dome 121 is configured to provide multi-axis damping to attenuate the transmission of the vibrations to the isolated payload through the shaft 129. In the illustrated embodiment, the elastomer dome 121 is also configured to deflect rotationally about the axial direction (i.e., rotationally around the y-axis in FIG. 4) to provide vibration isolation in a rotational direction. The configuration of the elastomer dome 121 (e.g., the geometry of the elastomer dome 121, including the shape, size, and thickness of the elastomer dome 121) and the material properties of the elastomer dome 121 (e.g., the material, hardness, and stiffness of the elastomer dome 121) may be selected depending on the magnitude of the vibrations and/or the shock input to the housing 118 from the vibration source and/or the desired degree of vibrational isolation provided to the payload connected to the shaft 129.

Additionally, when vibrations and/or a shock (or at least a component thereof) is imparted to the housing 118 along the axial direction of the housing 118 (i.e., the +y-direction in FIG. 4), at least a portion the elastomer dome 121 deflects axially in the direction of the first end 124 of the housing 118 (i.e., the −y-direction in FIG. 4). The deflection of the elastomer dome 121 in the direction of the first end 124 of the housing 118 reduces the volume of the primary isolation chamber 119 and thereby increases the pressure of the liquid 128 in the primary isolation chamber 119. A volume of liquid 128 in the primary isolation chamber 119 corresponding to the volume of liquid 128 in the primary isolation chamber 119 that was displaced by the deflection or deformation of the elastomer dome 121 is forced through the opening 127 (e.g., the conduit) in the partition 126 into the backpressure chamber 120. In this manner, the elastomer dome 121 is configured to function as a piston to pump a volume of the liquid 128 in the primary isolation chamber 119 to the backpressure chamber 120 through the opening 127 in response to vibrations and/or a shock imparted to the housing 118 of the isolator 106.

The backpressure membrane 122 is configured to deflect and/or deform (e.g., in the direction of the first end 124 of the housing 118) in response to the influx of additional liquid 128 into the backpressure chamber 120 (e.g., the backpressure membrane 122 is configured to expand axially in the direction of the first end 124 of the housing 118, which increases the size of the backpressure chamber 120 to accommodate the influx of additional liquid 128). The deflection or deformation of the backpressure membrane 122 in the axial direction (i.e., the negative y-direction in FIG. 4) toward the first end 124 of the housing 118 due to the influx of an additional volume of liquid 128 into the backpressure chamber 120 provides fluidic damping (e.g., hydraulic damping) along the axial direction (i.e., the y-axis in FIG. 4) of the shaft 129.

Additionally, in the illustrated embodiment, the cross-sectional size of the opening 127 in the partition 126 (e.g., the conduit) is smaller than the cross-sectional size of the chambers 119, 120 such that the opening 127 restricts the flow of the fluid between the primary chamber 119 and the backpressure chamber 120. This restriction of the liquid flow through the opening 127 is configured to provide fluidic damping to limit the transmission of vibrations and/or shock to the payload connected to the shaft 129. The configuration (e.g., shape and size) of the opening 127 in the partition 126 may be selected depending on the magnitude of the vibrations and/or shock input to the housing 118 from the vibration source and/or the desired level of fluidic damping. In one or more embodiments, the stiffness of the elastomer dome 121 is sufficiently soft to provide multi-axis damping, but stiff enough to pump a volume of the liquid 128 from the primary isolation chamber 119 to the backpressure chamber 120 through the opening 127 in the partition 126.

Additionally, the deflection and/or deformation of the backpressure membrane 122, which is formed of a resilient (e.g., elastic) material, generates a restorative force in an axial direction (i.e., the positive y-direction in FIG. 4) opposite to the direction in which the backpressure membrane 122 was deflected and/or deformed. This restorative force is configured to force (e.g., pump) a volume of the liquid 128 in the backpressure chamber 120 back through the opening 127 in the partition 126 into the primary isolation chamber 119. The restorative force supplied by the deflected backpressure membrane 122 is configured to force a volume of the liquid 128 into the primary isolation chamber 119 through the opening 127 until the pressure of the liquid 128 in the primary isolation chamber 119 substantially equals the pressure of the liquid 128 in the backpressure chamber 120 (i.e., the deflection and/or deformation of the backpressure membrane 122 is configured to change the pressure of the liquid 128 in the backpressure chamber 120 until a pressure equilibrium is reached between the liquid 128 in the primary isolation chamber 119 and the backpressure chamber 120). This cycle of pumping the liquid 128 between the primary isolation chamber 119 and the backpressure chamber 120 through the opening 127 in the partition 126 may continue as long as unwanted vibrations and/or shock are input to the housing 118 of the isolator 106 in order to provide fluidic damping to attenuate the transmission of the vibrations and/or the shocks to the isolated payload.

Accordingly, the embodiment of the isolator 106 illustrated in FIG. 4 is configured to provide both multi-axis isolation (e.g., translational and rotational isolation) due to the elastomer dome 121 being coupled between the housing 118 and the shaft 129, and fluidic damping (e.g., hydraulic damping) along the axial direction (i.e., the y-axis in FIG. 2C) due to the pumping of the liquid 128 between the chambers 119, 120 through the opening 127 (e.g., the conduit) in the partition 126.

Suitable isolators are described in U.S. application Ser. No. 15/957,202, filed Apr. 19, 2018, entitled "Fluid and Elastomer Vibration Isolator," and U.S. application Ser. No. 62/524,867, filed Apr. 26, 2017, entitled "Multi-Degree of Freedom Vibration Isolator," the entire contents of both of which are incorporated herein by reference. In one or more embodiments, the isolator may have any other configuration suitable for the vibrations and/or shocks that the system is designed to attenuate.

Figure 5:
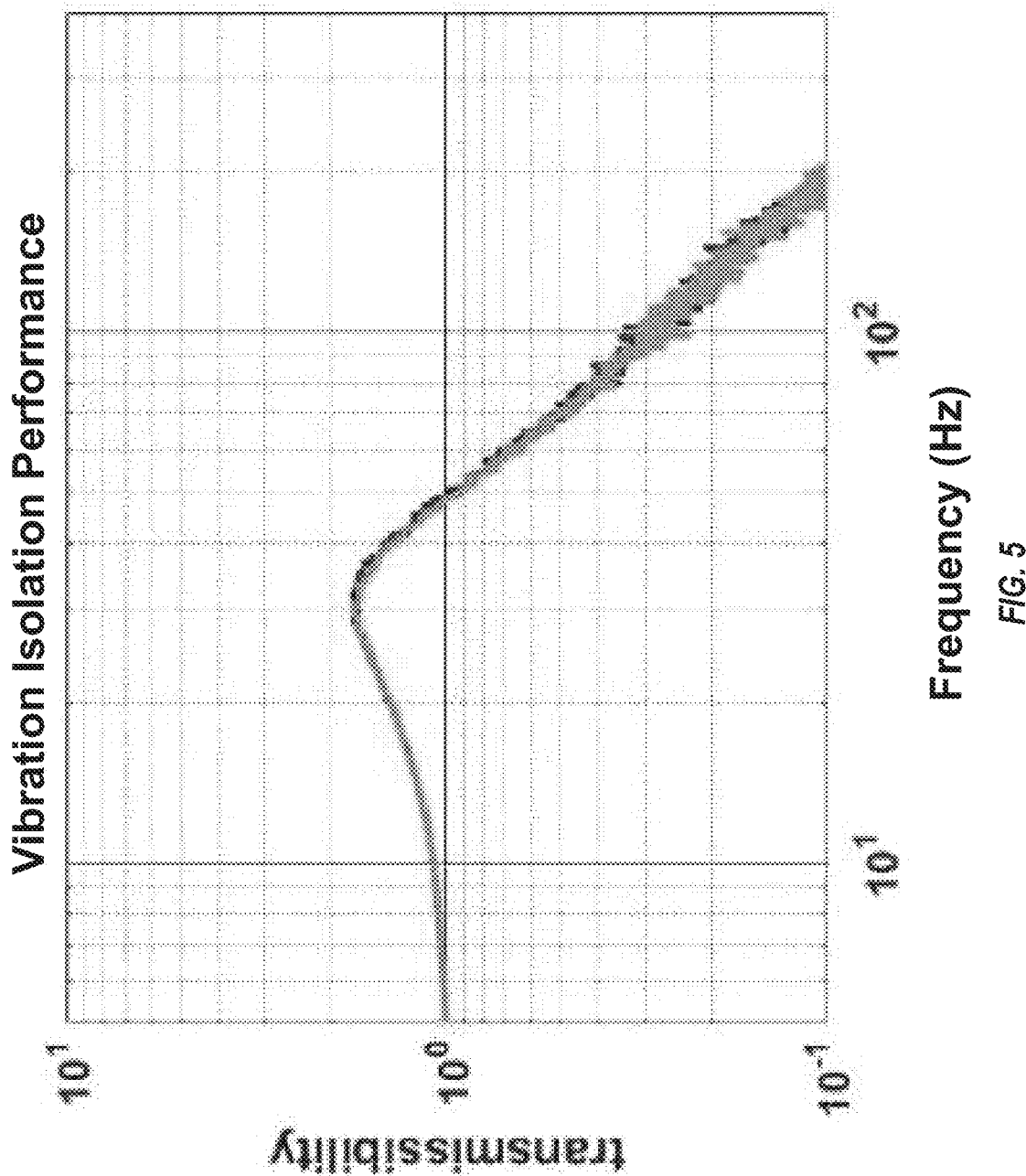
FIG. 5 is a graph comparing the vibration isolation performance of a system according to one embodiment of the present disclosure with and without a thermal strap.

FIG. 5 is a graph depicting the transmissibility of vibrations through a system 100 according to one embodiment of the present disclosure as a function of the vibration frequency compared to a system without the thermal strap 105. In one or more embodiments, the system 100 with and without the thermal strap 105 has a relatively low resonant frequency of approximately 30 Hz. As illustrated in FIG. 5, the vibration isolation performance of the system 100 with the thermal strap 105 is identical or substantially identical to the vibration isolation performance of the system 100 without the thermal strap 105, which demonstrates that the thermal strap 105 does not affect or does not substantially affect the vibration isolation performance of the system 100.

Figure 6A:
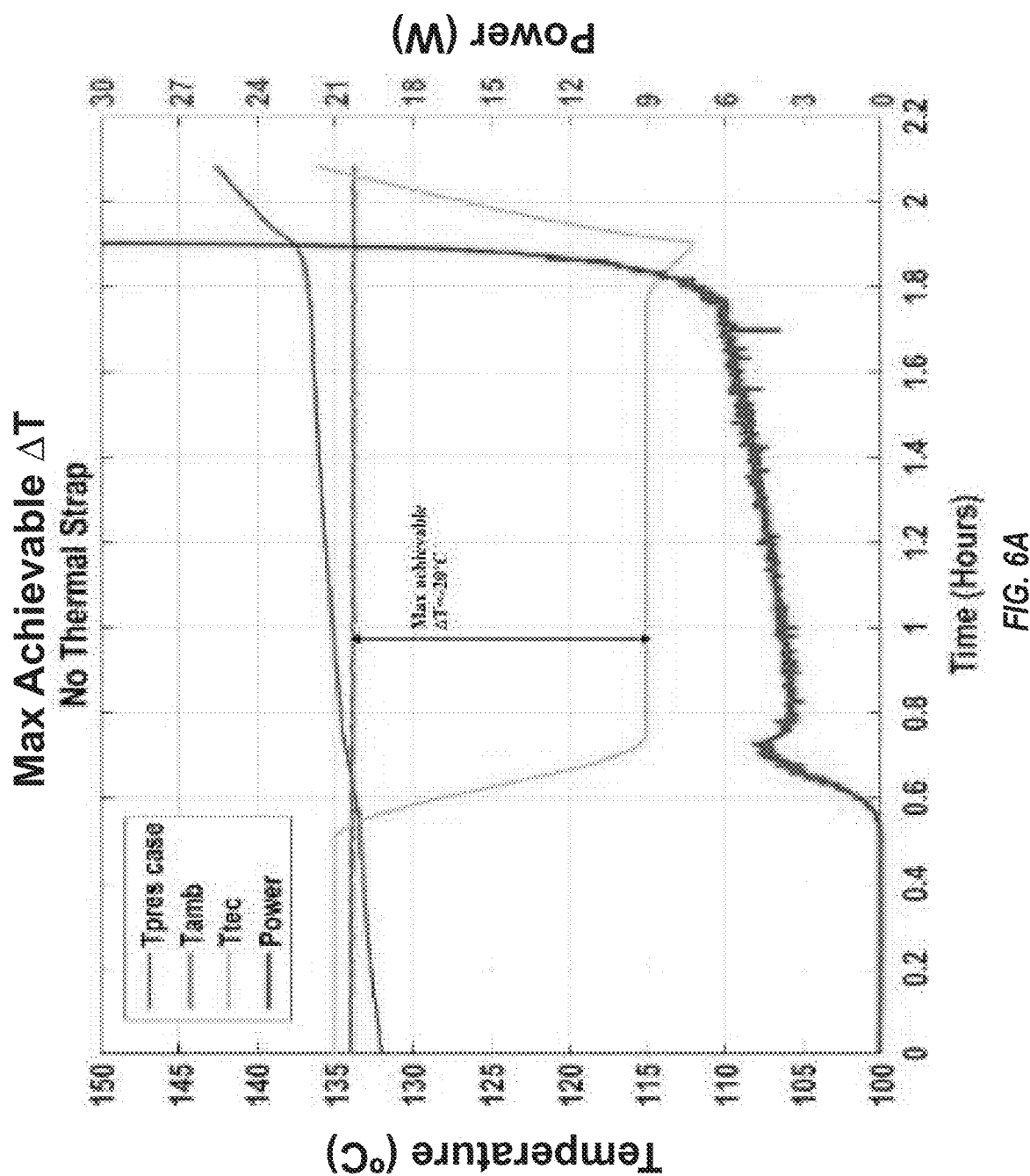
FIGS. 6A and 6B are graphs depicting the thermal performance of a system without a thermal strap and with a thermal strap, respectively.
Figure 6B:
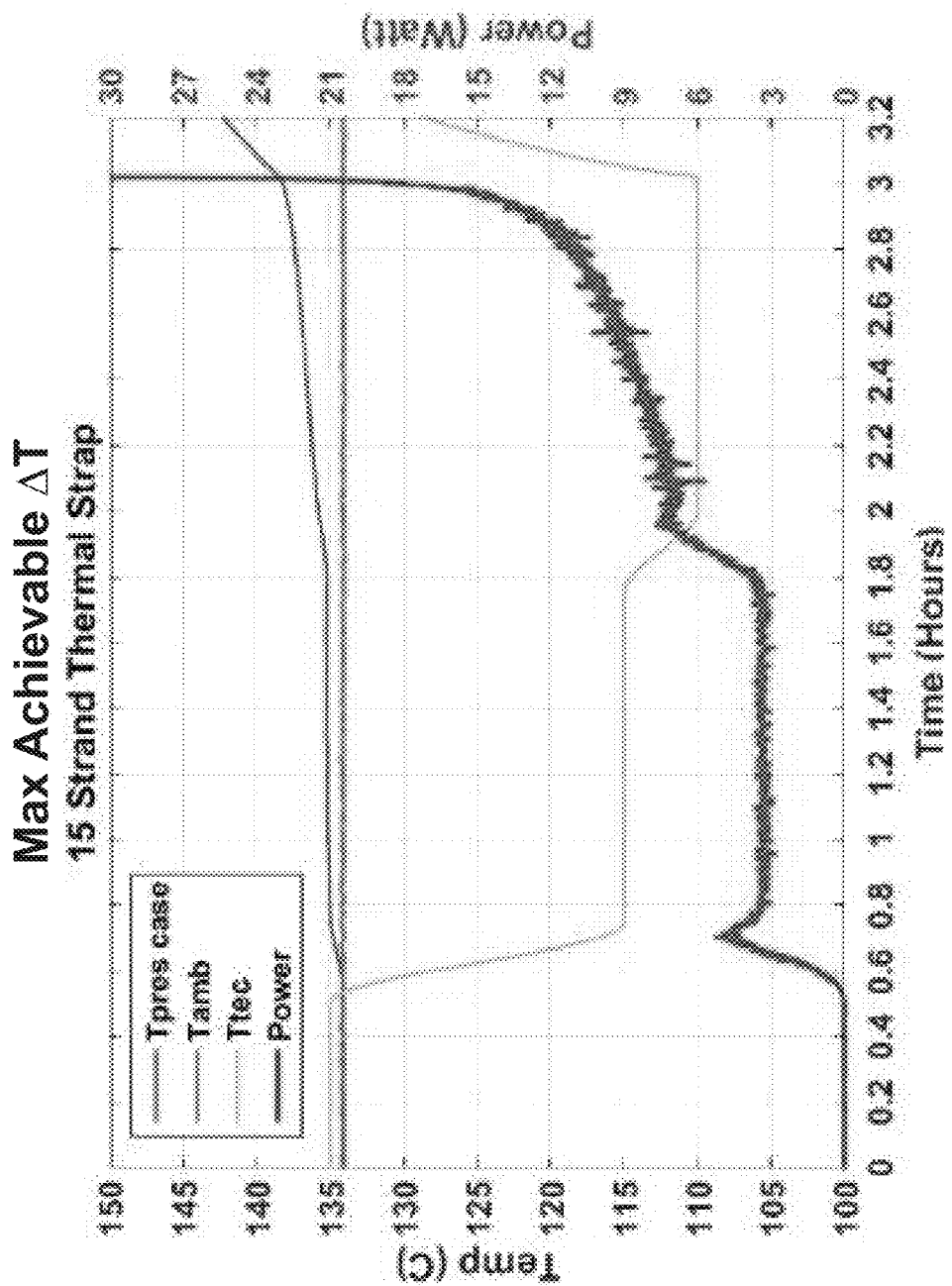

FIG. 6A is a graph illustrating the thermal performance of a system 100 according to one or more embodiments of the present disclosure without a thermal strap 105. As illustrated in FIG. 6A, the system 100 without the thermal strap 105 cannot achieve more than a 20° C. differential between the ambient temperature of 135° C. (indicated by the orange trace labeled Tamb in FIG. 6A) and the one or more electronic components 107 in the electronics housing 103 (the temperature of which is indicated by the yellow trace labeled Ttec in FIG. 6A) without resulting in thermal runaway. Also indicated in FIG. 6A are the temperature of the pressure casing (indicated by the blue trace labeled Tpres case) and the power (indicated by the red trace labeled Power) consumed by the thermoelectric cooler and control electronics. FIG. 6B illustrates the thermal performance of a system 100 with a thermal strap 105. As illustrated in FIG. 6B, the system 100 is configured to achieve a 25° C. differential between the ambient temperature of 135° C. and the one or more electronic components 107 in the electronics housing 103. Accordingly, in one or more embodiments, the thermal strap 105 improves the heat dissipation capability of the system 100 by approximately 5° C. compared to a system 100 without the thermal strap 105.

Figure 7:
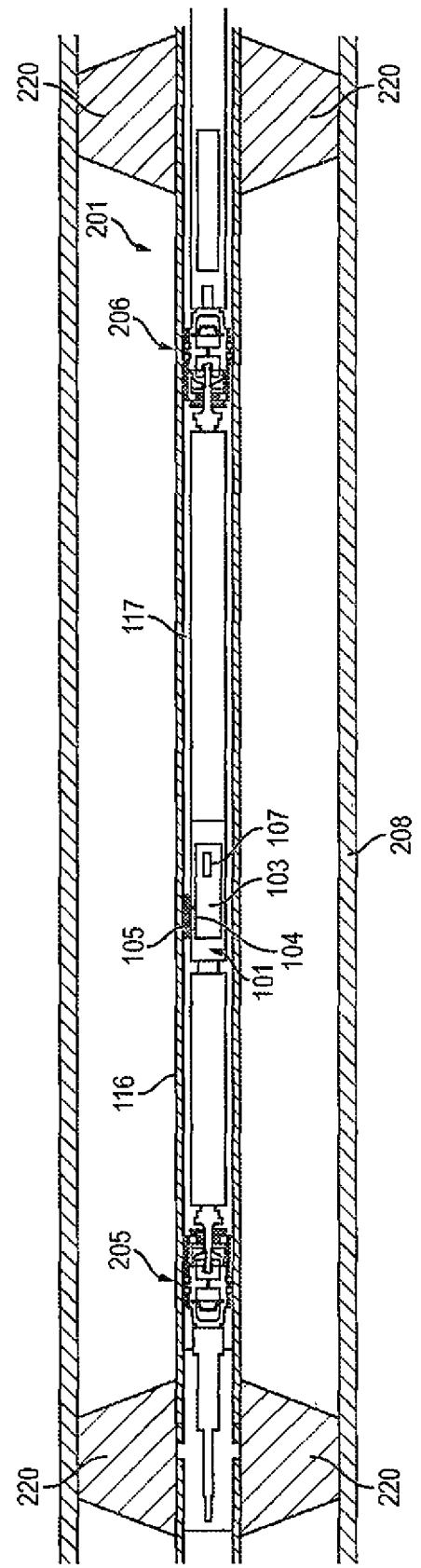
FIG. 7 is a cross-sectional view illustrating the system according to the embodiment in FIG. 1 utilized in a well casing to thermally regulate a sensor chassis and isolate the sensor chassis from unwanted vibrations and/or shocks.

FIG. 7 depicts a system 201 (e.g., a drill system) according to one or more embodiments of the present disclosure utilized, for example, in a petroleum drill well to isolate one or more electronic components 107 (e.g., one or more sensors) from unwanted vibrations and/or shocks. In the illustrated embodiment, the system 201 includes a sensor chassis 101 including an electronics housing 103 containing the one or more electronic components 107. In the illustrated embodiment, the system 201 also includes two isolators 205, 206 coupled to opposite ends of the sensor chassis 101. The isolators 205, 206 are configured to attenuate unwanted vibrations from a pressure casing 116 held rigidly concentric to a vibrating drill string 208 (of, for example, a petroleum drill well) by stabilizers 220. The isolators 205, 206 are configured to allow the sensor chassis 101 to translate and/or rotate within the pressure casing 116 with a prescribed amount of stiffness and damping such that desired degrees of freedom of motion of the sensor chassis 101 are isolated from the vibration of the drill string 208 and the pressure casing 116 rigidly connected thereto. In one or more embodiments, the isolators 205, 206 may be the same as or similar to the embodiment of the isolator 106 described above with reference to FIG. 4.

With continued reference to FIG. 7, the system 201 also includes a thermoelectric cooler 104 (e.g., a Peltier heat pump) coupled between the electronics housing 103 and the sensor chassis 101, and a thermal strap 105 coupled at one end to the sensor chassis 101 and at another end to the pressure casing 116. The thermal strap 105 is configured to transfer heat from the sensor chassis 101, across a gap 117 between the sensor chassis 101 and the pressure casing 116. The heat transferred to the pressure casing 116 by the thermal strap 105 is dissipated, for example, by drilling mud flowing around the pressure casing 116 during a drilling operation.

While this invention has been described in detail with particular references to exemplary embodiments thereof, the exemplary embodiments described herein are not intended to be exhaustive or to limit the scope of the invention to the exact forms disclosed. Persons skilled in the art and technology to which this invention pertains will appreciate that alterations and changes in the described structures and methods of assembly and operation can be practiced without meaningfully departing from the principles, spirit, and scope of this invention, as set forth in the following claims. Although relative terms such as "outer," "inner," "upper," "lower," and similar terms have been used herein to describe a spatial relationship of one element to another, it is understood that these terms are intended to encompass different orientations of the various elements and components of the invention in addition to the orientation depicted in the figures. Additionally, as used herein, the term "substantially," "about," and similar terms are used as terms of approximation and not as terms of degree, and are intended to account for the inherent deviations in measured or calculated values that would be recognized by those of ordinary skill in the art. Moreover, the tasks described above may be performed in the order described or in any other suitable sequence. Additionally, the methods described above are not limited to the tasks described. Instead, for each embodiment, one or more of the tasks described above may be absent and/or additional tasks may be performed. Furthermore, as used herein, when a component is referred to as being "on" another component, it can be directly on the other component or components may also be present therebetween. Moreover, when a component is referred to as being "coupled" to another component, it can be directly attached to the other component or intervening components may be present therebetween.

What is claimed is:

1. A system configured to provide thermal regulation and vibration isolation, the system comprising:
   a sensor chassis defining an interior chamber;
   an electronics housing in the interior chamber of the sensor chassis;
   a thermoelectric cooler coupled between the sensor chassis and the electronics housing;
   a thermal strap coupled to the sensor chassis; and
   at least one isolator coupled to the sensor chassis.

2. The system of claim 1, further comprising an insulating material in the interior chamber of the sensor chassis, the insulating material extending around the electronics housing.

3. The system of claim 2, wherein the insulating material comprises Aerogel.

4. The system of claim 1, wherein the thermal strap comprises first and second copper blocks and a plurality of copper wires extending between the first and second copper blocks.

5. The system of claim 4, wherein the thermoelectric cooler is coupled to a portion of an inner surface of the sensor chassis, and the first copper block of the thermal strap is coupled to a portion of an outer surface of the sensor chassis opposite the portion of the inner surface.

6. The system of claim 1, further comprising at least one clamp coupling the electronics housing to the sensor chassis.

7. The system of claim 6, wherein the at least one clamp comprises polyether ether ketone.

8. The system of claim 1, wherein the at least one isolator comprises:
   a primary chamber;
   a backpressure chamber;
   a liquid contained in the primary chamber and the backpressure chamber;
   a conduit extending between the primary chamber and the backpressure chamber, the conduit placing the primary chamber in fluid communication with the backpressure chamber;
   a backpressure membrane defining at least a portion of the backpressure chamber;
   an elastomer dome defining at least a portion of the primary chamber; and
   a shaft having a first end coupled to the elastomer dome and a second end coupled to the sensor chassis.

9. The system of claim 1, wherein the at least one isolator comprises a first isolator coupled to a first end of the sensor chassis and a second isolator coupled to a second end of the sensor chassis opposite the first end.

10. The system of claim 1, wherein the electronics housing comprises aluminum.

11. A drill system, comprising:
    a drill string;
    a pressure casing coupled to the drill string;
    a sensor chassis defining an interior chamber, the sensor chassis being housed in the pressure casing and spaced apart from the pressure casing by a gap;
    an electronics housing in the interior chamber of the sensor chassis;
    an insulating material in the interior chamber of the sensor chassis, the insulating material extending around the electronics housing;
    a thermoelectric cooler coupled between the sensor chassis and the electronics housing;
    a thermal strap extending across the gap, the thermal strap having a first end coupled to the sensor chassis and a second end coupled to the pressure casing; and
    at least one isolator coupled between the pressure casing and the sensor chassis.

12. The drill system of claim 11, wherein the insulating material comprises Aerogel.

13. The drill system of claim 11, wherein the thermal strap comprises first and second copper blocks and a plurality of copper wires extending between the first and second copper blocks.

14. The drill system of claim 13, wherein the thermoelectric cooler is coupled to a portion of an inner surface of the sensor chassis, and the first copper block of the thermal strap is coupled to a portion of an outer surface of the sensor chassis opposite the portion of the inner surface.

15. The drill system of claim 11, further comprising at least one clamp coupling the electronics housing to the sensor chassis.

16. The drill system of claim 15, wherein the at least one clamp comprises polyether ether ketone.

17. The drill system of claim 11, wherein the isolator comprises:
 a primary chamber;
 a backpressure chamber;
 a liquid contained in the primary chamber and the backpressure chamber;
 a conduit extending between the primary chamber and the backpressure chamber, the conduit placing the primary chamber in communication with the backpressure chamber;
 a backpressure membrane defining at least a portion of the backpressure chamber;
 an elastomer dome defining at least a portion of the primary chamber; and
 a shaft having a first end coupled to the elastomer dome and a second end coupled to the sensor chassis.

18. The drill system of claim 11, wherein the at least one isolator comprises a first isolator coupled to a first end of the sensor chassis and a second isolator coupled to a second end of the sensor chassis opposite the first end.

19. A method of thermally and vibrationally isolating a payload, the method comprising:
 inserting a thermoelectric cooler into an interior chamber of a sensor chassis;
 inserting an electronics housing accommodating the payload into the interior chamber and onto the thermoelectric cooler;
 injecting an insulating material into the interior chamber and around the electronics housing; and
 connecting a thermal strap to the sensor chassis.

* * * * *